US011972794B2

(12) United States Patent
Najafi

(10) Patent No.: US 11,972,794 B2
(45) Date of Patent: *Apr. 30, 2024

(54) SUPERCONDUCTIVE MEMORY CELLS AND DEVICES

(71) Applicant: PsiQuantum Corp., Palo Alto, CA (US)

(72) Inventor: Faraz Najafi, San Francisco, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/967,778

(22) Filed: Oct. 17, 2022

(65) Prior Publication Data

US 2023/0055589 A1    Feb. 23, 2023

Related U.S. Application Data

(63) Continuation of application No. 17/234,701, filed on Apr. 19, 2021, now Pat. No. 11,475,945, which is a
(Continued)

(51) Int. Cl.
*G11C 11/44* (2006.01)
*H10N 60/30* (2023.01)
(Continued)

(52) U.S. Cl.
CPC ............. *G11C 11/44* (2013.01); *H10N 60/30* (2023.02); *H10N 60/83* (2023.02); *H10N 60/84* (2023.02);
(Continued)

(58) Field of Classification Search
CPC ......... G11C 11/44; H01L 39/16; H01L 27/18; H01L 39/08; H01L 39/10; H01L 39/24; H01L 39/12
(Continued)

(56) References Cited

U.S. PATENT DOCUMENTS 3,059,196 A    10/1962 Lentz
3,119,076 A    1/1964 Schlig et al.
(Continued)

FOREIGN PATENT DOCUMENTS

CN    106289515 A    1/2017
CN    106549099 A    3/2017
(Continued)

OTHER PUBLICATIONS

Akhlaghi et al., "Gated Mode 145:149 Superconducting Nanowire Single Photon Detectors," Optics Express, vol. 20, No. 2, Jan. 16, 2012, 9 pgs.
(Continued)

*Primary Examiner* — Huan Hoang
*Assistant Examiner* — Minh Dinh
(74) *Attorney, Agent, or Firm* — Morgan, Lewis & Bockius LLP

(57) ABSTRACT

An electronic device includes a substrate and a layer of superconducting material disposed over the substrate. The layer of superconducting material includes a first wire and a loop that is (1) distinct and separate from the first wire and (ii) capacitively coupled to the first wire while the loop and the first wire are in a superconducting state.

20 Claims, 10 Drawing Sheets

Related U.S. Application Data continuation of application No. 16/543,256, filed on Aug. 16, 2019, now Pat. No. 10,984,857.

(60) Provisional application No. 62/765,240, filed on Aug. 16, 2018.

(51) Int. Cl.
  *H10N 60/83* (2023.01)
  *H10N 60/84* (2023.01)
  *H10N 69/00* (2023.01)
  *H10N 60/01* (2023.01)
  *H10N 60/85* (2023.01)

(52) U.S. Cl.
  CPC ............. *H10N 69/00* (2023.02); *H10N 60/01* (2023.02); *H10N 60/85* (2023.02)

(58) Field of Classification Search
  USPC ........................................................ 365/161
  See application file for complete search history.

(56) References Cited

U.S. PATENT DOCUMENTS

| | | | |
|---|---|---|---|
| 3,283,282 A | 11/1966 | Rosenberg | |
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 4,989,051 A | 1/1991 | Whitehead et al. | |
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,053,383 A | 10/1991 | Short et al. | |
| 5,127,928 A | 7/1992 | Farries et al. | |
| 5,173,620 A | 12/1992 | Fujimaki et al. | |
| 5,219,826 A | 6/1993 | Kapitulnik | |
| 5,247,475 A | 9/1993 | Hasunuma et al. | |
| 5,321,004 A | 6/1994 | Perez et al. | |
| 5,365,476 A | 11/1994 | Mukhanov | |
| 5,376,626 A | 12/1994 | Drehman et al. | |
| 5,455,519 A | 10/1995 | Ohori | |
| 5,481,119 A | 1/1996 | Higashino et al. | |
| 5,521,862 A | 5/1996 | Frazier | |
| 5,574,290 A | 11/1996 | You | |
| 5,719,105 A | 2/1998 | Odagawa et al. | |
| 5,825,240 A | 10/1998 | Geis et al. | |
| 5,831,278 A | 11/1998 | Berkowitz | |
| 5,892,644 A | 4/1999 | Evans | |
| 5,925,892 A | 7/1999 | Mizuno et al. | |
| 6,029,075 A | 2/2000 | Das et al. | |
| 6,078,517 A | 6/2000 | Herr | |
| 6,242,939 B1 | 6/2001 | Nagasawa | |
| 6,433,974 B2 | 8/2002 | Heismann | |
| 6,774,463 B1 | 8/2004 | Chaudhari et al. | |
| 7,227,438 B2 | 6/2007 | Song et al. | |
| 7,513,765 B2 | 4/2009 | Liao | |
| 7,558,030 B2 | 7/2009 | Lee et al. | |
| 7,589,323 B2 | 9/2009 | Tanaka et al. | |
| 7,724,083 B2 | 5/2010 | Herring et al. | |
| 7,847,282 B2 | 12/2010 | Sandhu | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 | 11/2013 | Smith | |
| 8,736,085 B2 | 5/2014 | Sines | |
| 9,293,240 B2 | 3/2016 | Kroulik | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,853,645 B1 | 12/2017 | Mukhanov et al. | |
| 9,876,505 B1 | 1/2018 | Dai et al. | |
| 9,954,158 B2 | 4/2018 | You et al. | |
| 9,998,122 B2 | 6/2018 | Hamilton et al. | |
| 10,103,736 B1 | 10/2018 | Powell et al. | |
| 10,133,986 B1 | 11/2018 | Newton et al. | |
| 10,171,086 B2 | 1/2019 | McCaughan et al. | |
| 10,177,298 B1 | 1/2019 | Taylor et al. | |
| 10,186,858 B2 | 1/2019 | Klaus et al. | |
| 10,197,440 B2 | 2/2019 | Najafi | |
| 10,262,776 B2 | 4/2019 | Choi et al. | |
| 10,361,703 B2 | 7/2019 | Najafi | |
| 10,386,229 B2 | 8/2019 | Najafi et al. | |
| 10,396,733 B2 | 8/2019 | Najafi et al. | |
| 10,454,014 B2 | 10/2019 | Najafi et al. | |
| 10,454,016 B2 | 10/2019 | Fong et al. | |
| 10,566,516 B2 | 2/2020 | Najafi | |
| 10,573,800 B1 | 2/2020 | Najafi | |
| 10,586,910 B2 | 3/2020 | Najafi | |
| 10,620,044 B2 | 4/2020 | Thompson et al. | |
| 10,651,325 B2 | 5/2020 | Najafi et al. | |
| 10,879,905 B2 | 12/2020 | Najafi et al. | |
| 10,897,235 B2 | 1/2021 | Najafi et al. | |
| 10,911,031 B2 | 2/2021 | Wise et al. | |
| 10,944,403 B2 | 3/2021 | Najafi | |
| 10,984,857 B2 * | 4/2021 | Najafi ................... H10N 60/83 |
| 11,009,387 B2 | 5/2021 | Chung et al. | |
| 11,475,945 B2 | 10/2022 | Najafi | |
| 2002/0149453 A1 | 10/2002 | Snitchler et al. | |
| 2003/0087503 A1 | 5/2003 | Sakaguchi et al. | |
| 2005/0153843 A1 | 7/2005 | Kubota | |
| 2005/0197254 A1 | 9/2005 | Stasiak et al. | |
| 2006/0073979 A1 | 4/2006 | Thieme et al. | |
| 2006/0183327 A1 | 8/2006 | Moon | |
| 2006/0270224 A1 | 11/2006 | Song et al. | |
| 2008/0026234 A1 | 1/2008 | Sambasivan et al. | |
| 2008/0197285 A1 | 8/2008 | Frey et al. | |
| 2008/0272302 A1 | 11/2008 | Frey et al. | |
| 2009/0014433 A1 | 1/2009 | O'Neil et al. | |
| 2010/0026447 A1 | 2/2010 | Keefe et al. | |
| 2010/0171098 A1 | 7/2010 | Suzuki | |
| 2011/0108803 A1 | 5/2011 | Deligianni et al. | |
| 2011/0116742 A1 | 5/2011 | Chang et al. | |
| 2011/0254053 A1 | 10/2011 | Goupil et al. | |
| 2013/0012392 A1 | 1/2013 | Tanaka et al. | |
| 2013/0090244 A1 | 4/2013 | Shinzato et al. | |
| 2013/0124112 A1 | 5/2013 | Heath et al. | |
| 2013/0143744 A1 | 6/2013 | Marsili et al. | |
| 2013/0341594 A1 | 12/2013 | Mohseni et al. | |
| 2014/0113828 A1 | 4/2014 | Gilbert et al. | |
| 2014/0299751 A1 | 10/2014 | Tang et al. | |
| 2015/0018218 A1 | 1/2015 | Lakrimi et al. | |
| 2015/0179916 A1 | 6/2015 | Pramanik et al. | |
| 2015/0348681 A1 | 12/2015 | Huh | |
| 2016/0028402 A1 | 1/2016 | McCaughan et al. | |
| 2016/0028403 A1 | 1/2016 | McCughan et al. | |
| 2016/0356708 A1 | 12/2016 | Bennett et al. | |
| 2017/0186933 A1 | 6/2017 | Sunter et al. | |
| 2018/0033944 A1 | 2/2018 | Ladizinsky et al. | |
| 2018/0145664 A1 | 5/2018 | Herr et al. | |
| 2018/0335343 A1 | 11/2018 | Najafi et al. | |
| 2018/0364097 A1 | 12/2018 | Najafi | |
| 2018/0374979 A1 | 12/2018 | Nozawa | |
| 2019/0027672 A1 | 1/2019 | Megrant | |
| 2019/0035904 A1 | 1/2019 | Najafi | |
| 2019/0035999 A1 | 1/2019 | Najafi | |
| 2019/0044051 A1 | 2/2019 | Caudillo et al. | |
| 2019/0109595 A1 | 4/2019 | Najafi | |
| 2019/0148848 A1 | 5/2019 | Najafi et al. | |
| 2019/0227230 A1 | 7/2019 | Novack et al. | |
| 2019/0288132 A1 | 9/2019 | Wang et al. | |
| 2019/0378874 A1 | 12/2019 | Rosenblatt et al. | |
| 2020/0066962 A1 | 2/2020 | Najafi | |
| 2020/0080890 A1 | 3/2020 | Najafi et al. | |
| 2020/0111944 A1 | 4/2020 | Moodera et al. | |
| 2020/0176662 A1 | 6/2020 | Dayton et al. | |
| 2020/0194656 A1 | 6/2020 | Najafi | |
| 2020/0256722 A1 | 8/2020 | Najafi et al. | |

(56) References Cited

U.S. PATENT DOCUMENTS

2021/0183767 A1    6/2021    Najafi et al.
2021/0239518 A1    8/2021    Chung et al.

FOREIGN PATENT DOCUMENTS

| | | |
|---|---|---|
| DE | 2440576 B1 | 1/1976 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |
| WO | WO90/14715 A1 | 11/1990 |
| WO | WO94/09566 A1 | 4/1994 |
| WO | WO/2012052628 A1 | 4/2012 |

OTHER PUBLICATIONS

Atikian, Haig A. et al., "Superconducting Nanowire Single Photon Detector on Diamond," arXiv: 1401.4490v1, physics.optics, Jan. 17, 2014, 5 pgs.

Cheng, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv: 1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv: 1204.0616v2 [cond-mat-supr-con] Aug. 22, 2012, 6 pgs.

Hortensius, H.L. et al., "Critical-Current Reduction in Thin Superconducting Wires Due to Current Crowding," arXiv: 1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-No. resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosophy in Electrical Engineering, 22 pgs.

Murphy et al., "Nanoscale superconducting memory based on the kinetic inductance of asymmetric nanowire loops," Department of Physics, University of Illinois at Urbana- Champaign, arXiv: 1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, 17 pgs.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AlN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AlN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

McCaughan, A.N., et al., "Using Geometry to Sense Current," Nano Letters 16 (2016), 6 pgs.

Saraswat et al., "Highly oriented, free-standing, superconducting NbN films growth on chemical vapor deposited graphene," APL Materials 2, 056103 (2014); https://doi.org/10.1063/1.4875356 (Year: 2014), 7 pgs.

Stanfield, CMOS-Compatible, Piezo-Optomechanically Tunable Photonics for Visible Wavelengths and Cryogenic Temperatures, vol. 27, Issue 20, p. 28588-28605, 2019, 18 pgs.

D. Sahin et al., "Waveguide photon-number-resolving detectors for quantum photonic integrated circuits", Appl. Phys. Lett., vol. 103, No. 11, p. 111116, Sep. 2013, 16 pgs.

Sergio Pagano et al., "Nano-Strip Three-Terminal Superconducting Device for Cryogenic Detector Readout", IEEE Transactions On Applied Superconductivity, vol. 21, No. 3, Jun. 2011, 4 pgs.

PsiQuantum Corp., International Search Report and Written Opinion, PCT/US2018/033042, Aug. 28, 2018, 13 pgs.

PsiQuantum Corp., International Search Report and Written Opinion, PCT/US2018/033041, Jul. 27, 2018, 16 pgs.

PsiQuantum Corp., International Search Report and Written Opinion, PCT/US2018/044091, Nov. 7, 2018, 13 pgs.

PsiQuantum Corp., Invitation to Pay Additional Fees/Partial Search Report, PCT/US2018/037892, Aug. 20, 2018, 12 pgs.

PsiQuantum Corp., Invitation to Pay Additional Fees/Partial Search Report, PCT/US2018/054414, Jan. 24, 2019, 21 pgs.

PsiQuantum Corp., International Search Report and Written Opinion, PCT/US2018/054414, Mar. 20, 2019, 21 pgs.

Najafi, Non-Final Office Action dated Dec. 12, 2018, U.S. Appl. No. 16/028,288, 6 pgs.

Najafi, Notice of Allowance dated Apr. 5, 2019, U.S. Appl. No. 16/028,288, 10 pgs.

Najafi, Non-Final Office Action, U.S. Appl. No. 16/028,293, Sep. 21, 2018, 8 pgs.

Najafi, Final Office Action, U.S. Appl. No. 16/028,293, Mar. 1, 2019, 5 pgs.

Najafi, Notice of Allowance, U.S. Appl. No. 16/012,520, Sep. 21, 2018, 9 pgs.

Najafi, Non-Final Office Action, U.S. Appl. No. 16/136,124, Apr. 4, 2019, 9 pgs.

Najafi, Quayle Office Action, U.S. Appl. No. 16/151,180, Jan. 31, 2019, 5 pgs.

Najafi, Notice of Allowace, U.S. Appl. No. 16/151,180, Mar. 14, 2019, 5 pgs.

Najafi, Notice of Allowance U.S. Appl. No. 16/151,190, Feb. 6, 2019, 11 pgs.

Najafi, Notice of Allowance U.S. Appl. No. 16/151,190, Mar. 28, 2019, 5 pgs.

Najafi, Non-Final Office Action, U.S. Appl. No. 16/046,815, Feb. 4, 2019, 9 pgs.

Najafi, Non-Final Office Action, U.S. Appl. No. 16/046,807, Mar. 18, 2019, 10 pgs.

Najafi, Non-Final Office Action, U.S. Appl. No. 16/107,143, Mar. 19, 2019, 11 pgs.

PsiQuantum, International Search Report and Written Opinion, PCT/US2019/017687, Apr. 30, 2019, 13 pgs.

PsiQuantum Corp., International Search Report, PCT/US2019/017691, Apr. 23, 2019, 7 pgs.

PsiQuantum Corp., International Search Report and Written Opinion, PCT/US2019/030019, Jul. 17, 2019, 8 pgs.

PsiQuantum Corp., PCT/US2018/044091, International Preliminary Report on Patentability, Jan. 28, 2020, 6 pgs.

Najafi, Non-Final Office Action, U.S. Appl. No. 16/664,716, Apr. 1, 2020, 15 pgs.

PsiQuantum, International Search Report Jan. 27, 2020, 13 pgs.

(56) References Cited

OTHER PUBLICATIONS

PsiQuantum, International Preliminary Report on Patentability, PCT/US2018/033041, Nov. 26, 2019, 8 pgs.
PsiQuantum, International Preliminary Report on Patentability, PCT/US2018/054414, Apr. 8, 2020, 15 pgs.
PsiQuantum, International Search Report and Written Opinion, PCT/US2018/037892, Oct. 17, 2018, 18 pgs.
PsiQuantum, International Preliminary Report on Patentability, PCT/US2018/037892, Dec. 17, 2019, 12 pgs.
Najafi, Non-Final Office Action, U.S. Appl. No. 16/553,068, Apr. 1, 2020, 11 pgs.
Najafi, Non-Final Office Action, U.S. Appl. No. 16/544,718, Aug. 17, 2020, 6 pgs.
Najafi, Non-Final Office Action, U.S. Appl. No. 16/656,506, Aug. 13, 2020, 18 pgs.
Najafi, Notice of Allowance, U.S. Appl. No. 16/553,068, Sep. 18, 2020, 8 pgs.
Najafi, Notice of Allowance, U.S. Appl. No. 16/473,550, Sep. 24, 2020, 8 pgs.
Najafi, Notice of Allowance, U.S. Appl. No. 16/656,506, Nov. 3, 2020, 12 pgs.
Najafi, Final Office Action, U.S. Appl. No. 16/664,716, Oct. 16, 2020, 14 pgs.
Najafi, Notice of Allowance, U.S. Appl. No. 16/473,547, Dec. 9, 2020, 8 pgs.
Najafi, Non-Final Office Action, U.S. Appl. No. 17/234,701, Feb. 1, 2020, 14 pgs.
Najafi, Notice of Allowance, U.S. Appl. No. 17/234,701, Jun. 6, 2022, 9 pgs.
Najafi, Notice of Allowance, U.S. Appl. No. 16/543,256, Dec. 9, 2020, 13 pgs.
Najafi, Notice of Allowance, U.S. Appl. No. 16/543,256, Dec. 9, 2020, 12 pgs.
Chung, Non-Final Office Action, U.S. Appl. No. 16/849,829, Aug. 21, 2020, 5 pgs.
Chung, Notice of Allowance, U.S. Appl. No. 16/849,829, Dec. 8, 2020, 5 pgs.
PsiQuantum Corp., International Search Report and Written Opinion, PCT/US2020/028519, Jan. 12, 2021, 9 pgs.
PsiQuantum Corp., Notice of Allowance, U.S. Appl. No. 16/849,829, Mar. 1, 2021, 8 pgs.
PsiQuantum Corp., Notice of Allowance, U.S. Appl. No. 16/544,718, Feb. 5, 2021, 6 pgs.
PsiQuantum Corp., Notice of Allowance, U.S. Appl. No. 16/664,716, Jan. 28, 2021, 8 pgs.
PsiQuantum, Notice of Allowance, U.S. Appl. No. 16/840,166, Mar. 23, 2021, 7 pgs.
PsiQuantum, Notice of Allowance, U.S. Appl. No. 16/664,716, Apr. 21, 2021, 8 pgs.
PsiQuantum, Notice of Allowance, U.S. Appl. No. 16/575,274, Apr. 22, 2021, 10 pgs.
PsiQuantum, International Preliminary Report on Patentability, PCT/US2018/033042, Nov. 19, 2019, 7 pgs.
PsiQuantum, International Search Report, PCT/US2018/033041, Jul. 27, 2018, 12 pgs.
PsiQuantum, International Preliminary Report on Patentability, PCT/US2019/051853, Mar. 23, 2021, 10 pgs.
PsiQuantum, International Preliminary Report on Patentability, PCT/US2019/017687, Aug. 18, 2020, 6 pgs.
PsiQuantum, International Preliminary Report on Patentability, PCT/US2019/030019, Nov. 3, 2020, 7 pgs.
PsiQuantum, Notice of Allowance, U.S. Appl. No. 16/840,166, May 24, 2021, 5 pgs.
Najafi, Non-Final Office Action, U.S. Appl. No. 16/623,503, Jun. 23, 2021, 15 pgs.
Najafi, Non-Final Office Action, U.S. Appl. No. 17/135,861, Sep. 23, 2021, 6 pgs.
PsiQuantum, International Preliminary Report on Patentability, PCT/US2019/016885, Aug. 11, 2020, 7 pgs.
PsiQuantum, International Search Report and Written Opinion, PCT/US2019/016885, Apr. 24, 2019, 9 pgs.
Thompson, Non-Final Office Action, U.S. Appl. No. 16/450,911, Aug. 2, 2019, 6 pgs.
Thompson, Notice of Allowance, U.S. Appl. No. 16/450,911, Dec. 11, 2019, 5 pgs.
Thompson, Non-Final Office Action, U.S. Appl. No. 16/985,137, Sep. 30, 2021, 6 pgs.
Najafi, Notice of Allowance, U.S. Appl. No. 16/046,807, Oct. 29, 2019, 7 pgs.
Najafi, Non-Final Office Action, U.S. Appl. No. 16/136,124, Apr. 4, 2019, 8 pgs.
Najafi, Notice of Allowance, U.S. Appl. No. 16/136,124, Jun. 27, 2019, 8 pgs.
PsiQuantum Corp., International Search Report and Written Opinion, PCT/US2018/060802, Apr. 8, 2019, 6 pgs.
PsiQuantum, International Preliminary Report on Patentability, PCT/US2018/060802, May 19, 2020, 13 pgs.
Najafi, Notice of Allowance, U.S. Appl. No. 16/773,921, Sep. 22, 2021, 8 pgs.
Najafi, Notice of Allowance, U.S. Appl. No. 17/195,522, Nov. 12, 2021, 8 pgs.
Najafi, Notice of Allowance, U.S. Appl. No. 16/773,921, Nov. 15, 2021, 8 pgs.
Najafi, Notice of Allowance, U.S. Appl. No. 17/033,337, Dec. 9, 2021, 8 pgs.
Chung, Non-Final Office Action, U.S. Appl. No. 17/232,086, Dec. 16, 2021, 6 pgs.
Najafi, Notice of Allowance, U.S. Appl. No. 17/135,861, Jan. 28, 2022, 7 pgs.
Thompson, Non-Final Office Action, U.S. Appl. No. 16/985,137, Jan. 18, 2022, 8 pgs.
Najafi, Notice of Allowance, U.S. Appl. No. 16/623,503, Feb. 22, 2022, 10 pgs.
Najafi, Notice of Allowance, U.S. Appl. No. 17/033,337, Feb. 25, 2022, 7 pgs.
Najafi, Non-Final Office Action, U.S. Appl. No. 16/813,628, Mar. 7, 2022, 7 pgs.
Najafi, Non-Final Office Action, U.S. Appl. No. 17/160,283, Mar. 31, 2022, 17 pgs.
Najafi, Non-Final Office Action, U.S. Appl. No. 17/234,701, Feb. 1, 2022, 13 pgs.

* cited by examiner

SUPERCONDUCTIVE MEMORY CELLS AND DEVICES

RELATED APPLICATION

This application is a continuation of U.S. patent application Ser. No. 17/234,701, filed Apr. 19, 2021, which is a continuation of U.S. patent application Ser. No. 16/543,256, filed Aug. 16, 2019, now U.S. Pat. No. 10,984,857, which claims the benefit of, and priority to, U.S. Provisional Application 62/765,240, filed Aug. 16, 2018, which is hereby incorporated by reference in its entirety.

TECHNICAL FIELD

This relates generally to electronic devices (e.g., memory cells) and, more specifically, to memory cells that operate based on the properties of superconducting materials.

BACKGROUND

In electrical circuits and devices, there is often a need to store information. The need to store information ranges from single bit applications (e.g., storage of register values) to applications in random access memory (RAM) and long-term data storage. Memory cells, which store one or more bits of information, are the fundamental building blocks of information storage devices. Thus, memory cells are essential components in many memory devices.

Superconductors are materials capable of operating in a superconducting state with exactly zero electrical resistance under particular conditions. Because of many useful properties of superconductors, memory cells based on superconductors are expected to have superior performance over conventional memory cells. However, prior memory devices that include superconductors had limited reliability.

SUMMARY

Accordingly, there are needs for memory cells based on superconductivity with high reliability. The present disclosure provides thin film memory cells based on superconducting materials, thereby utilizing the advantages of superconducting materials (e.g., zero resistance under certain conditions). In addition, the unique structure of memory cells allows improved operational reliability. Furthermore, memory cells that are superconducting can be integrated more easily (e.g., monolithically) with other superconducting components in circuits and devices. Such circuits and devices are often used for making sensitive measurements. For example, superconducting circuits play a critical role in superconducting quantum interference devices (SQUIDs). Superconducting components also play an important role in sensitive optical measurements, which have applications in quantum computing. For these purposes, there is a need for memory cells whose operating principles are based on the properties of superconducting materials.

In accordance with some embodiments, an electronic device (e.g., a memory cell) is provided. The electronic device includes a substrate and a layer of superconducting material disposed over the substrate. The layer of superconducting material is patterned to form a plurality of distinct instances of the layer of superconducting material including: a first wire and a loop that is (i) distinct and separate from the first wire and (ii) capacitively coupled to the first wire while the loop and the first wire are in a superconducting state. The loop is configured to form a persistent current via the capacitive coupling in response to a write current applied to the first wire while the loop and the first wire are in the superconducting state. The persistent current represents a logic state of the electronic device.

Additionally, in accordance with some embodiments, an electronic device (e.g., a memory cell) is provided. The electronic device includes a first wire made of a superconducting material and a loop that is made of a superconducting material. The loop is distinct and separate from any other electrical wire, including the first wire. The loop is capacitively coupled to the first wire while in a superconducting state. The loop is configured to form a persistent current via the capacitive coupling in response to a write current applied to the first wire. The persistent current represents a logic state of the electronic device.

Additionally, the present disclosure provides a method of using a thin film memory device based on superconducting materials. The method includes obtaining an electronic device comprising: a substrate; a first wire of superconducting material disposed over the substrate; and a loop of superconducting material disposed over the substrate. When the loop and the first wire are in a superconducting state, the loop is capacitively coupled to the first wire. The method further includes, while the loop and the first wire are in a superconducting state, applying a current to the first wire, thereby transferring a persistent current to the loop via the capacitive coupling between the first wire and the loop. The persistent current in the loop represents a logic state.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Figure 1A:
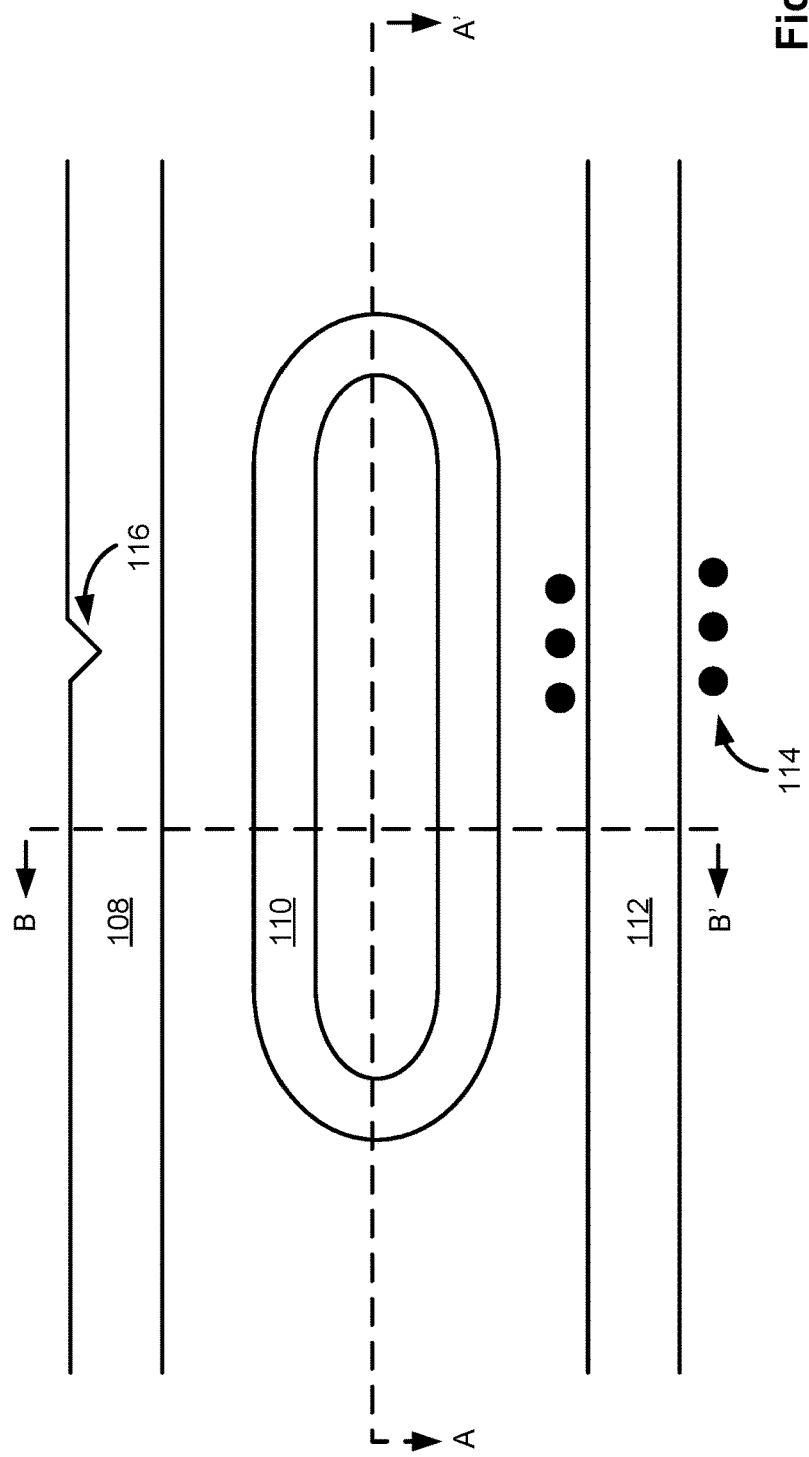
FIGS. 1A-1C are schematic diagrams illustrating a plan view and cross-sectional views, respectively, of a superconducting memory cell in accordance with some embodiments.

The memory cells described herein operate based on the particular properties of superconducting materials, namely that superconducting materials have zero-resistance while in a superconducting state but become resistive (e.g., non-superconducting) under certain conditions. For example, a superconducting material superconducts (e.g., has zero electrical resistance) only below a particular temperature (called the material's critical temperature) (e.g., the superconducting material is in a superconducting state having zero electrical resistance only below the critical temperature). This temperature is specific to the particular superconducting material and varies with the ambient pressure. For example, at one atmosphere of pressure (e.g., 101 kPa), niobium (Nb) superconducts below 9.26 kelvin while niobium oxide (NbO) superconducts below 1.38 kelvin.

In addition, superconducting materials can support only a limited density of electrical current before transitioning to a resistive state. The limit on the amount of current density that the superconducting material can support before becoming resistive is called the critical current density. For example, a superconducting material conducts a current having a current density below the critical current density with no electrical resistance (e.g., at a temperature below the superconducting material's critical temperature) and the superconducting material conducts a current having a current density above the critical current density with non-zero electrical resistance (e.g., even at a temperature below the superconducting material's critical temperature). The critical current density is also specific to the material and dependent on various external conditions (e.g., ambient pressure, magnetic field).

The devices described herein take advantage of these effects. In particular, the present disclosure provides a memory cell that operates based on superconductivity. Accordingly, a memory cell is provided that includes an isolated loop of superconducting material and a wire, separated from the loop, made of superconducting material (e.g., the same superconducting material or a different superconducting material). The wire can be used to write information to the loop (e.g., write one or more bits of information). As long as both the write wire and the loop are superconducting, the loop of superconducting material is capacitively coupled to the write wire. Under these conditions, a write current applied to the write wire will "jump" to the superconducting loop via the capacitive coupling (e.g., the write current has an AC component that is transferred to the loop through the capacitive coupling). Because the superconducting loop has zero-resistance in the superconducting state, the current on the loop is persistent and will remain on the loop until it is time for the datum to be read out. In other words, in response to application of a write current to the write wire, the superconducting loop stores a persistent circulation current that can represent a logic state of the memory cell (e.g., a "0" or a "1").

In some embodiments, phase transitions (e.g., to a resistive state) are used to control other aspects of memory management. For instance, in some embodiments, the device further includes a read wire made of superconducting material and a heating element to heat the read wire. In some embodiments, the heating element initially remains in an "on" state, which heats the read wire above its critical temperature and maintains the read wire in a resistive state. When the heating element is turned off, the read wire drops below its critical temperature, becomes superconducting, and is capacitively coupled to the loop. A persistent current on the loop will then jump to the read wire, allowing a read out operation. In such embodiments, the heating element gates the read out of the memory cell so that read out is delayed until the heating element is turned off. Similarly, heating the loop to a resistive state can be used to erase the logic state of the loop (e.g., when the loop becomes resistive, the persistent current will resistively dissipate).

In some embodiments, the critical current density of superconducting materials is used to control certain operations of the memory cell. For example, in some embodiments, the write wire includes a constriction (e.g., a notch) that is designed (e.g., geometrically) to cause the current density in the write wire to exceed its critical current density after the persistent current has been formed in the loop. This causes the write wire to become resistive, which eliminates (or at least adequately diminishes) the capacitive coupling between the write wire and the loop. Thus, in some embodiments, the write wire "auto-deactivates" upon application of a write current so that the persistent current in the loop does not "jump back" to the write wire.

The memory cells described herein thus take advantage of the benefits of superconducting materials (e.g., their zero-resistance and their phase transitions to resistive states). In addition, because the memory cell is made from superconducting materials, the devices described herein can be easily integrated (e.g., monolithically) with other superconducting circuitry, thus interfacing seamlessly with applications where superconducting circuitry is used to manipulate information.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

As used herein, the term "superconducting circuit" means a circuit for which some aspect of the circuit's functionality relies on the superconducting properties of superconducting materials. In some embodiments, a superconducting circuit includes a superconducting material.

As used herein, the term "superconducting material" means a material that exhibits superconducting behavior under certain conditions (e.g., temperature, pressure, magnetic, and current density conditions). When those conditions are met, the superconducting material is said to be in a superconducting state. For example, a superconducting material is a material that operates as a superconductor (e.g., operates with zero electrical resistance) when cooled below a particular temperature (called the critical temperature) and having less than a threshold current density flowing through it (called the critical current density). Depending on the conditions, a superconducting material may also be in a resistive, or non-superconducting, state (e.g., a state in which the material has a non-zero electrical resistance). For example, a superconducting material supplied with a current that exceeds the critical current density for the superconducting material transitions from a superconducting state having zero electrical resistance to a non-superconducting state having non-zero electrical resistance. Thus, as used herein, a superconducting material is one that is capable of superconducting under certain conditions, but need not always be superconducting.

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is in a superconducting state). In some embodiments, a length of a wire is greater than a width or a thickness of the wire (e.g., the length of a wire is at least 5, 6, 7, 8, 9, or 10 times greater than the width and the thickness of the wire).

Figure 1B:
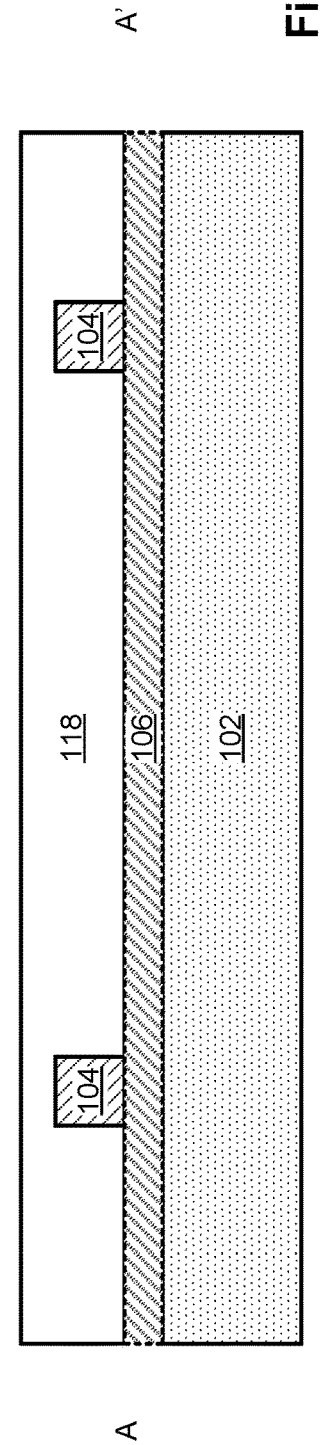
Figure 1C:
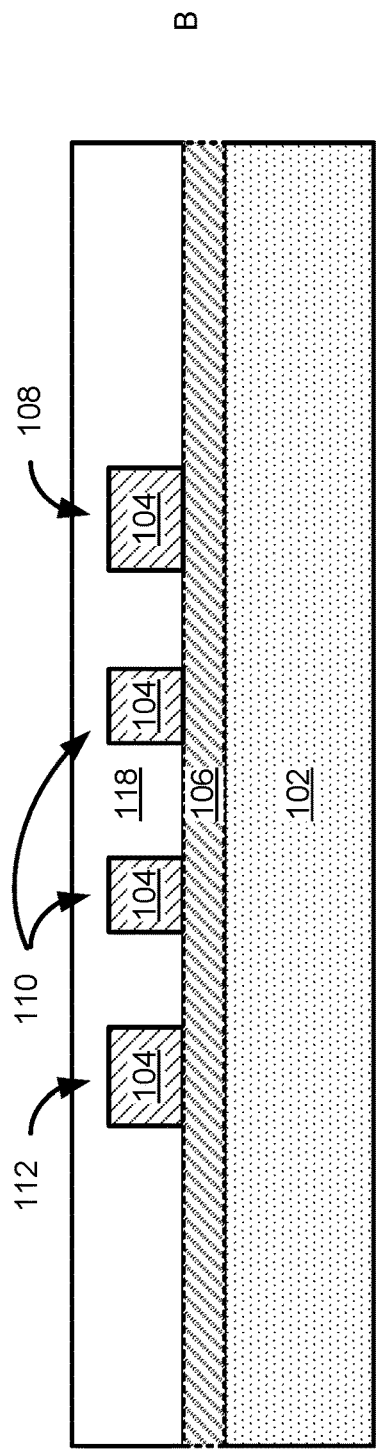

FIGS. 1A-1C illustrate a plan view and cross-sectional views, respectively, of a superconducting memory cell 100 in accordance with some embodiments. In particular, FIG. 1B shows a cross-sectional view along cross-section AA' shown in FIG. 1A, and FIG. 1C shows a cross-sectional view along cross-section BB' shown in FIG. 1A.

FIG. 1A illustrates a superconducting memory cell 100 in accordance with some embodiments. In some embodiments, a memory cell is a fundamental building block of memory devices (e.g., computer memory). To that end, a memory cell is, generally, an electronic circuit that stores one or more bits of information (e.g., binary information), which can be represented by a charge or current stored in the memory cell (e.g., some embodiments described below represent a bit as a current stored within a loop). The memory cell can be set to indicate a logical 1 state and reset to indicate a logical 0 state (e.g., a current on the loop is stored to indicate the logical 1 state and the current on the loop is removed to indicate the logical 0 state, or vice-versa). Additionally or alternatively, the memory cell can be set to indicate a logical 0 state and reset to indicate a logical 1 state. The state indicated by the memory cell is maintained and stored until it is changed by a set/reset process. The state indicated by the memory cell can be accessed by, for example, determining the current stored in the memory cell.

In some embodiments, superconducting memory cell 100 includes a substrate 102 (e.g., a silicon substrate, a quartz substrate, or any other suitable substrate). In some embodiments, substrate 102 is a portion of a wafer (e.g., a chip). The wafer may have a thickness of several hundreds of microns (e.g., a standard 400 µm wafer). In some embodiments, some or all of the remaining components of superconducting memory cell 100 are fabricated upon or over (e.g., monolithically integrated with) substrate 102. For example, superconducting memory cell 100 includes a patterned layer of superconducting material 104 disposed over the substrate (e.g., directly on substrate 102 or with one or more optional intervening layers 106 between substrate 102 and the patterned layer of superconducting material 104). For example, in some embodiments, the one or more optional intervening layers 106 include an adhesion layer that increases adherence between the substrate 102 and the patterned layer of superconducting material 104. The patterned layer of superconducting material 104 can be formed by depositing a layer of the superconducting material (e.g., niobium, niobium oxide, etc.) using a standard deposition technique (e.g., magnetron sputtering) and then patterning the deposited layer of superconducting material using standard lithographic techniques, such as optical lithography or e-beam lithography, combined with etching of unwanted portions of the layer of superconducting material. In some embodiments, the patterned layer of superconducting material 104 has a thickness of a few nanometers to tens of nanometers. Thus, it should be noted that FIGS. 1A-1B are not drawn to scale, but rather are drawn to illustrate the arrangement of the various components.

The layer of superconducting material is patterned to form a plurality of distinct instances of the layer of superconducting material. In some embodiments, a distinct instance of a layer of material is an isolated region of the material (e.g., not connected to any other instance via the material). For example, as shown in FIG. 1C, the layer of superconducting material is patterned to form a first wire 108 (a write wire, as described below) and a loop 110 that is (i) distinct and separate from first wire 108 and (ii) capacitively coupled to the first wire 108 while first wire 108 and loop 110 are in a superconducting state. First wire 108 and loop 110 are distinct instances of the layer of superconducting material because they are not connected to one another by the layer of superconducting material.

Figure 1D:
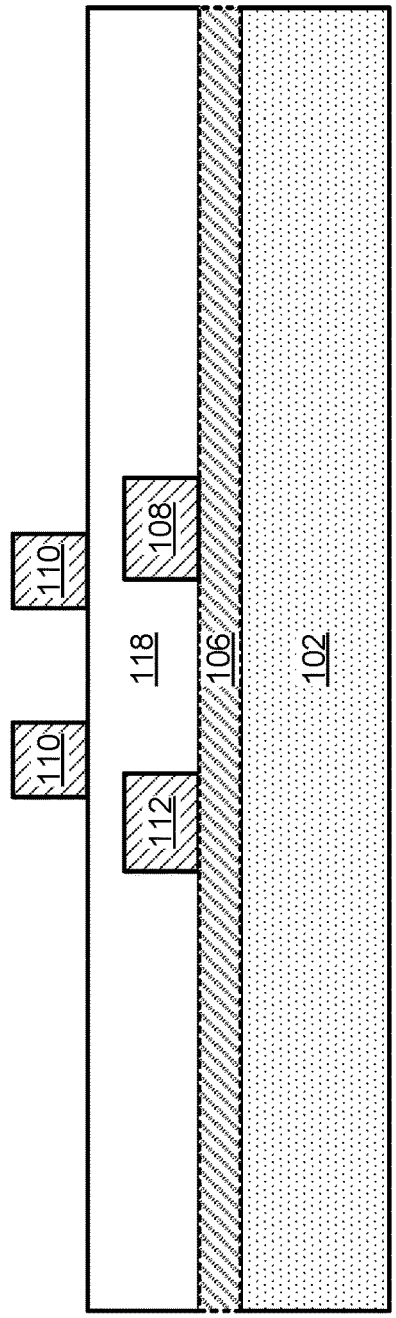
FIG. 1D is a schematic diagram illustrating a cross-sectional view of a superconducting memory device cell in accordance with some embodiments.

Alternatively, in some embodiments, first wire 108 is made of a first superconducting material (e.g., niobium) and loop 110 is a made of a second superconducting material that is different from the first superconducting material (e.g., cadmium). For example, in some embodiments, a layer of the first superconducting material is deposited and etched to form first wire 108. Subsequently, a layer of the second superconducting material, different from the first, is deposited and etched to form loop 110. In some embodiments, first wire 108 and loop 110 are made of the same superconducting material, but are formed from different layers of the superconducting material, as shown in FIG. 1D. For example, in some embodiments, a layer of the superconducting material is deposited and etched to form first wire 108 and a different layer of the same superconducting material is deposited and etched to form loop 110. In some circumstances, using separate layers of the same superconducting material for first wire 108 and loop 110 is desirable, for example, to control the thicknesses of first wire 108 and loop 110 separately (thereby controlling their respective critical currents) or to form first wire 108 and loop 110 in a vertical arrangement rather than side-by-side (e.g., the side-by-side arrangement is shown in FIGS. 1A-1C and the vertical arrangement is shown in FIG. 1D).

As explained in greater detail with reference to FIGS. 2A-2F, loop 110 is a bit-storage element, and, to that end, is configured to form a persistent current representing a logic state of the superconducting memory cell 100 in response to a write current applied to first wire 108. When first wire 108 and loop 110 are in the superconducting state, the write current is transferred to loop 110 by the capacitive coupling.

As used herein, two elements are capacitively coupled when they are AC-coupled (e.g., but not DC-coupled). In some embodiments, two elements are capacitively coupled (e.g., AC coupled) when there is no direct conductive pathway between the first element and the second element (e.g., there is no conductive material connecting the first element with the second element). Nonetheless, when two elements are capacitively coupled, the first element and second element are in electrical communication via a displacement current. When the first element is capacitively coupled to the second element, an AC current on the first element is transferred to the second element, and vice-versa, but a DC current on the first element is not transferred to the second element, and vice-versa.

In some embodiments, the spacing between first wire 108 and loop 110 is configured to provide the capacitive coupling (e.g., the geometry of the patterning of the layer of superconducting material provides the capacitive coupling). In some embodiments, a distance between first wire 108 and loop 110 provides the capacitive coupling (e.g., a portion of first wire 108 closest to loop 110 is 10, 15, or 30 nm from loop 110, which provides an adequate capacitance to form a persistent current in loop 110 in response to a write current of predefined magnitude on first wire 108).

In some embodiments, the plurality of distinct instances of the layer of superconducting material 104 includes a second wire 112 (e.g., a read wire) that is distinct and separate from first wire 108 and loop 110. Alternatively, second wire 112 may be made of a different superconducting material than first wire 108 and/or loop 110. Still alternatively, second wire 112 may be made from a different layer of the same superconducting material as first wire 108 and/or loop 110. Second wire 112 is capacitively coupled to loop 110 while loop 110 and second wire 112 are in the superconducting state. As explained in greater detail with reference to FIGS. 2A-2F, second wire 112 is configured to, while loop 110 and second wire 112 are in the superconducting state, form a read current via the capacitive coupling in response to the persistent current in loop 110.

In some embodiments, superconducting memory cell 100 includes a heating element 114 thermally coupled to second wire 112. In some embodiments, heating element 114 includes a resistive heater. In such embodiments, when heating element 114 remains activated (e.g., in an "on" state) current passes through the resistive heater to generate heat. In some embodiments, superconducting memory cell 100 includes, or is part of a larger memory device that includes, circuitry to activate and deactivate the heating element (e.g., memory device 300, FIG. 3). The heating element 114 is configured to, when activated, heat second wire 112 above a critical temperature of the superconducting material so that the superconducting material in second wire 112 is not in the superconducting state (e.g., heat second wire 112 so that it is in a resistive state). Heating second wire 112 above its superconducting material's critical temperature prevents read-out of the memory cell (e.g., loop 110 and second wire 112 are not capacitively coupled when second wire 112 is in the resistive state). Thus, in some embodiments, heating element 114 delays (e.g., gates) the read out of superconducting memory cell 100 until heating element 114 is deactivated in response to a control signal requesting read out. For example, when heating element 114 is deactivated, second wire 112 is cooled (e.g., cryogenically) below the critical temperature of the superconducting material of second wire 112 so that the superconducting material of second wire 112 is in the superconducting state, resulting in capacitive coupling between loop 110 and second wire 112, which allows the read current to form in second wire 112.

The heating element 114 thereby prevents the persistent current from jumping to the second wire before read out of superconducting memory cell 100. When superconducting memory cell 100 is ready to be read out, heating element 114 is deactivated so that second wire 112 cools below the critical temperature, thereby enabling the capacitive coupling between loop 110 and second wire 112 so that the persistent current pulse "jumps" to second wire 112, where it can be read out.

In some embodiments, superconducting memory cell 100 disables first wire 108 when there is already a persistent current on loop 110 (e.g., by eliminating or adequately diminishing the capacitive coupling between first wire 108 and loop 110). In some embodiments, superconducting memory cell 100 disables first wire 108 by transitioning first wire 108 out of its superconducting state to its resistive state. To that end, in some embodiments, first wire 108 has a notch 116 formed therein at a location along first wire 108. In some embodiments, notch 116 is filled with insulating material so that the conductive path of first wire 108 is narrower at notch 116. In some embodiments, notch 116 is configured (e.g., geometrically, using the selection criteria, described below) to transition first wire 108 from a superconducting state to a resistive state upon application of a write current of predefined magnitude. The dimensions of first wire 108 at notch 116 are selected so that a current density of the write current (e.g., which has a predefined magnitude) at the location along first wire 108 exceeds critical current density of first wire 108, thereby transitioning first wire 108 from the superconducting state to a resistive state upon application of the write current. For example, in some embodiments, the layer of superconducting material 104 has a thickness t (e.g., first wire 108 has thickness t). A non-constricted (e.g., upstream) portion of first wire 108 has width $w_1$. Notch 116 creates a location in first wire 108 that has a minimum width $w_2$. The thickness t and the minimum width $w_2$ are selected such that the write current exceeds the critical current density at the location of the constriction.

As noted above, when a write current is applied along the first wire, the write current "jumps" to loop 110 to form the persistent current in loop 110, which stores the logic state of the memory cell (e.g., stores one or more bits). Notch 116 effectively de-activates first wire 108 by causing the current density to exceed the critical current density, thus transitioning first wire 108 to a resistive state. This eliminates (or at least adequately diminishes) the capacitive coupling between first wire 108 and loop 110, which is present only when first wire 108 and loop 110 are both superconducting. Eliminating the capacitive coupling prevents the persistent current from "jumping back" to first wire 108 once the persistent current circles loop 110. In some embodiments, notch 116 is positioned along first wire 108 such that there is sufficient capacitive coupling between first wire 108 and loop 110 for the write current to "jump" to the loop 110 (e.g., form the persistent current) while also causing first wire 108 to transition to a resistive state before the persistent current circles loop 110 and returns to a side of loop 110 proximal to first wire 108 (e.g., first wire 108 goes resistive before the persistent current has an opportunity to "jump back").

In some embodiments, the capacitive coupling between first wire 108 and loop 110 is governed by the geometry of the patterning of superconducting material 104. In some embodiments, loop 110 is elongated along a direction of first wire 108. For example, as shown in FIG. 1A, loop 110 has a "race track" shape. The long edge of the race track shape of loop 110 is substantially parallel to first wire 108, increasing the capacitive coupling between first wire 108 and loop 110. Other ways of geometrically increasing the capacitive coupling between the first wire and the loop will be apparent to one of ordinary skill in the art. For example, in some embodiments, first wire 108 is curved to remain at a substantially uniform distance from loop 110 over a portion of loop 110 (e.g., first wire 108 and loop 110 together form a "ball and socket" shape).

In some embodiments, superconducting memory cell 100 further includes a dielectric material 118 disposed in a coplanar fashion with first wire 108 and loop 110. In some embodiments, dielectric material 118 increases the capacitance of the first wire 108 and loop 110 (e.g., to increase the capacitive coupling between first wire 108 and loop 110). In some embodiments, dielectric material 118 fills in the space between first wire 108 and loop 110. In some embodiments, dielectric material 118 is deposited after the patterned layer of superconducting material 104 is formed (e.g., dielectric material 118 is deposited over the patterned layer of superconducting material 104). In some embodiments, dielectric material 118 covers the patterned layer of superconducting material 104 so that the dielectric material 118 also serves as a protective layer for the patterned layer of superconducting material 104.

Figure 2A:
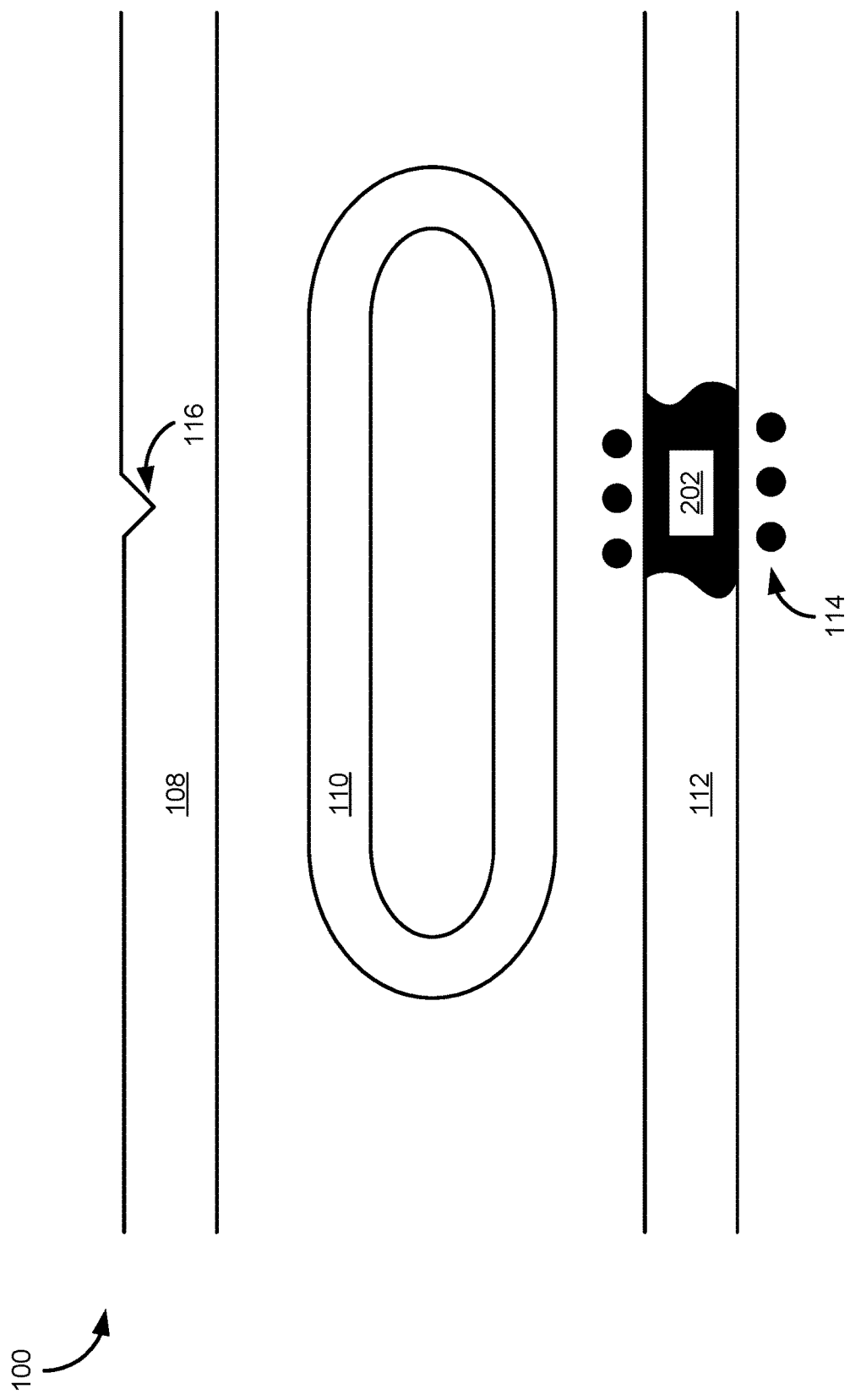
FIGS. 2A-2F are schematic diagrams illustrating an example of the operation of a superconducting memory cell in accordance with some embodiments.

FIGS. 2A-2F provide an example illustrating the operation of a superconducting memory cell 100 (FIGS. 1A-1B) in accordance with some embodiments. FIG. 2A shows superconducting memory cell 100 at a first time that is prior to application of a write current to first wire 108. At the first time, a control current is supplied to heating element 114 (e.g., a resistive heater thermally coupled with second wire 112). When activated, heating element 114 delays (e.g., gates) the read out of superconducting memory cell 100 by preventing current from "jumping" to second wire 112 (e.g., from loop 110). To that end, heating element 114 heats a portion of second wire 112 above its critical temperature and creates a resistive region 202. In some embodiments, because heating element 114 has a relatively slow switching time (e.g., takes a relatively long time to heat/cool in response to activation/deactivation, as compared with the time it takes to apply a write current), heating element 114 has a default activated state and is deactivated when a read operation is requested.

In some embodiments, first wire 108 and loop 110 are in a superconducting state. While first wire 108 and loop 110 are in the superconducting state, first wire 108 and loop 110 are capacitively coupled. In some embodiments, first wire 108 and loop 110 are cooled below the critical temperature of their respective superconducting materials (which, in some embodiments, is the same superconducting material) to maintain first wire 108 and loop 110 in a superconducting state. In some embodiments, the entire superconducting memory cell 100 (e.g., the chip on which superconducting memory cell 100 is formed) is cooled below the critical temperature of the lowest superconducting material used in superconducting memory cell 100 to maintain first wire 108 and loop 110 in a superconducting state.

Figure 2B:
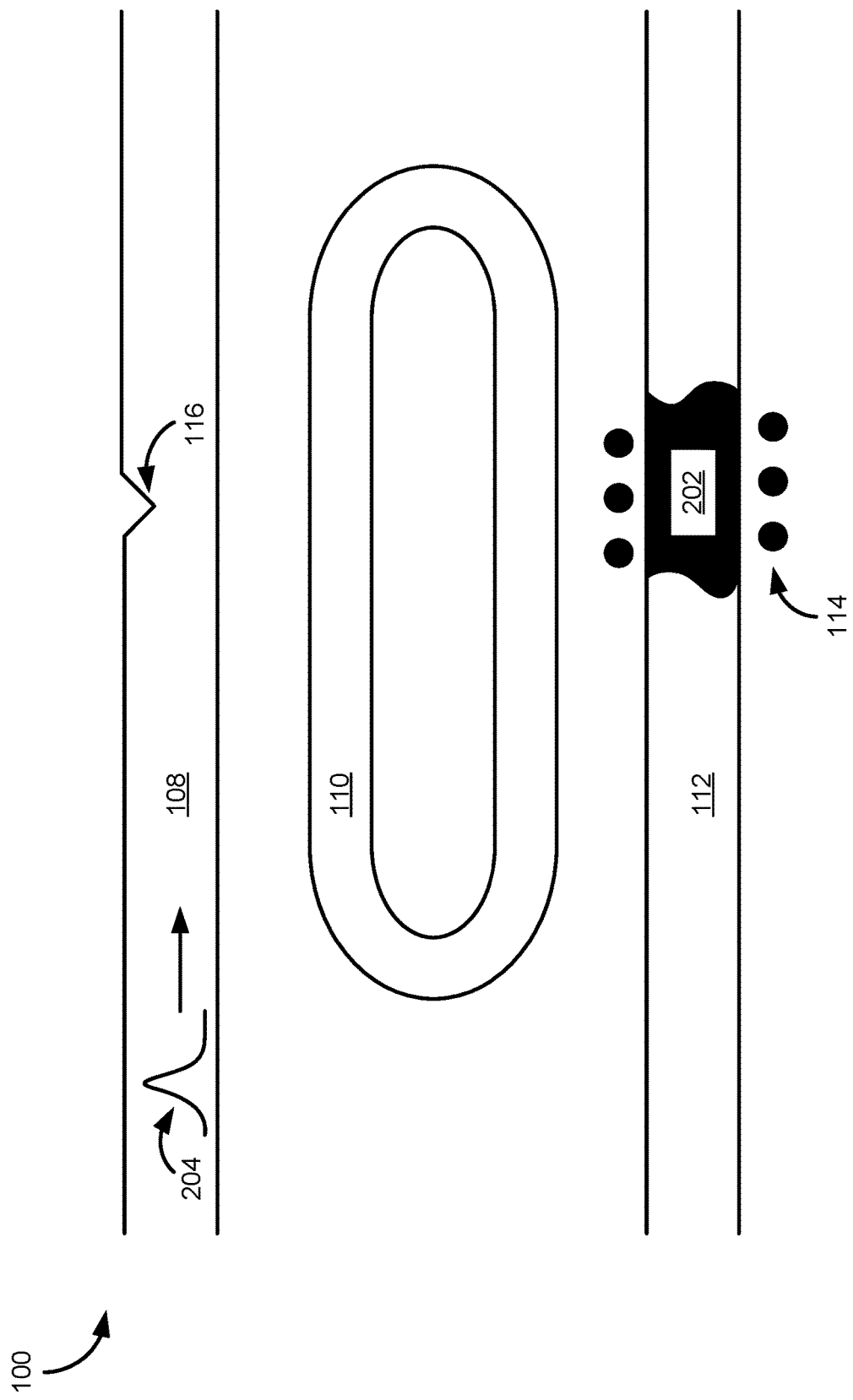
Figure 2C:
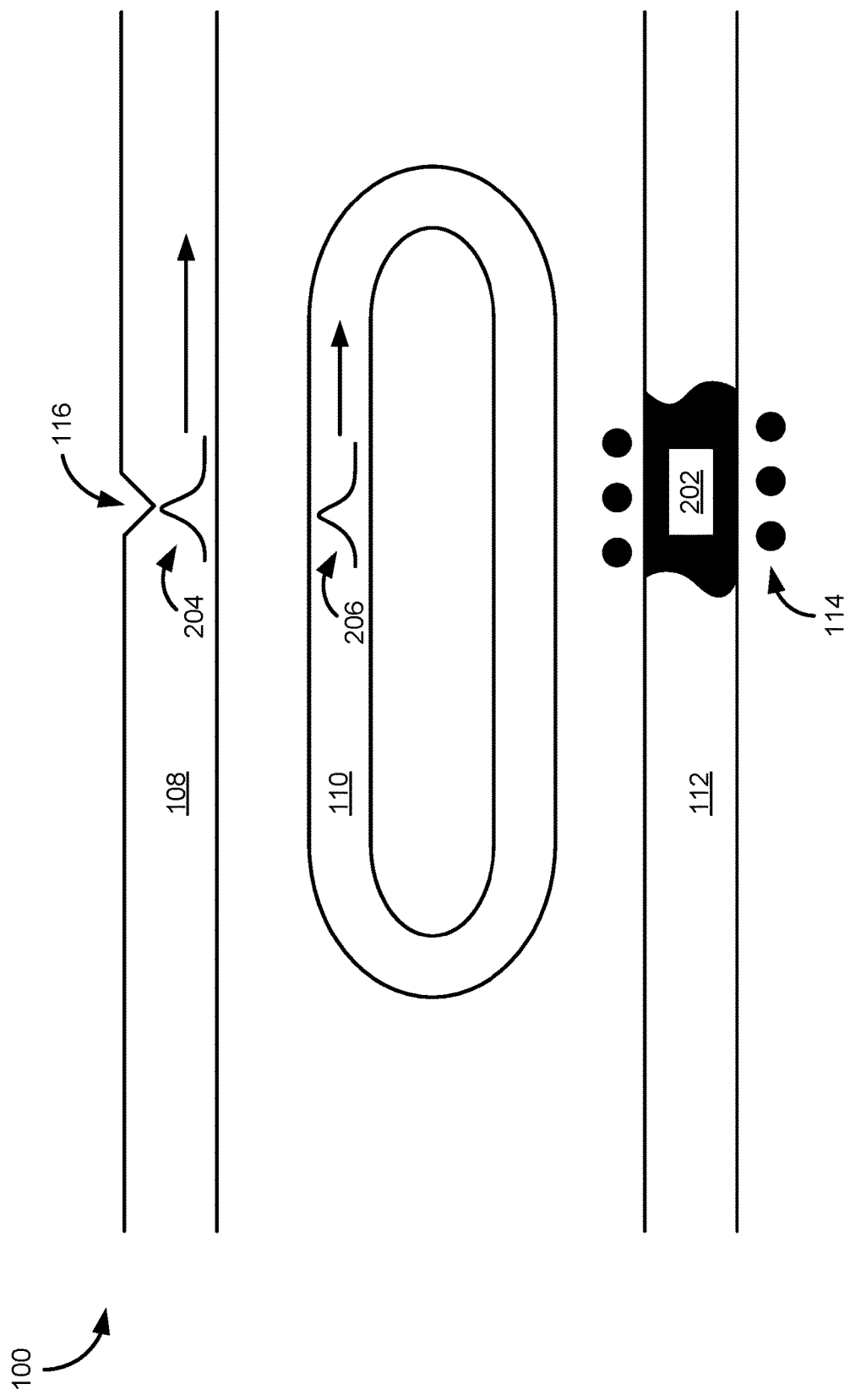

FIG. 2B shows superconducting memory cell 100 at a second time (e.g., after the first time). At the second time, a write current 204 is applied to first wire 108 while loop 110 and first wire 108 are in the superconducting state. In some embodiments, write current 204 has a predefined magnitude and/or a predefined duration. As a result, at a third time (e.g., very shortly after the second time), as shown in FIG. 2C, a persistent current 206 representing a logic state of superconducting memory cell 100 (e.g., representing a bit) is formed on loop 110. In some embodiments, because loop 110 has zero resistance in the superconducting state, persistent current 206 remains on loop 110 as long as loop 110 remains in the superconducting state (e.g., until loop 110 transitions to the resistive state).

FIG. 2C also illustrates write current 204 reaching notch 116. The purpose of notch 116 is to transition first wire 108, upon application of write current 204, to a resistive (non-superconducting) state so that the persistent current 206 does not "jump back" to first wire 108 (e.g., notch 116 disables the capacitive coupling after transferring a current to loop 110). To that end, first wire 108 and notch 116 are, in some embodiments, geometrically configured so that write current 204 (e.g., of predefined magnitude) remains below the critical current density in portions of first wire 108 not constricted by notch 116 and exceeds the critical current density at the constriction formed by notch 116.

These geometrical constraints provide selection criteria from which superconducting memory cell 100 can be designed (e.g., from which first wire 108 and, more specifically, notch 116 can be designed). In accordance with some embodiments, the selection criteria described below use simplifying assumptions, such as a uniform current distribution through a cross-section of first wire 108. The current distribution can, however, in accordance with some embodiments, be more accurately determined using any of a variety of simulation tools, thus resulting in a more accurate design of notch 116. The term "selection criteria" should therefore be construed as numerically- or analytically-calculated design constraints on the geometry of notch 116. In some embodiments, the selection criteria provide a set of suitable values for the predefined magnitude and/or duration for the write current 204, the thickness t of the patterned layer of superconducting material 104, the width $w_1$ of the unconstricted portion of first wire 108, and/or the minimum width $w_2$ of the constricted portion of first wire 108. The term "selection rule" is used below to denote analytical selection criteria (e.g., equations rather than numerical simulations) based on simplifying assumptions (e.g., toy physical models of superconducting memory cell 100).

To that end, assuming uniform current distribution in first wire 108, the requirement that the write current remain below the critical current density in the unconstricted portion of first wire 108 gives rise to a first selection rule:

$$\frac{I_w}{w_1 \times t} < j_c \quad (1)$$

where $I_w$ is the predefined magnitude of the write current 204 (e.g., a peak/maximum magnitude of write current 204) and $j_c$ is the critical current density for the superconducting material from which first wire 108 is formed.

The requirement that write current 204 exceed the critical current density at the location of the constricted portion of first wire 108 with minimum width $w_2$ gives rise to a second selection rule:

$$\frac{I_w}{w_2 \times t} \geq j_c \quad (2)$$

In some embodiments, the patterned layer of superconducting material 104 (FIG. 1B) is a thin film having a thickness between 2 nm and 10 nm (thus the first wire has a thickness between 2 nm and 10 nm). In some embodiments, first wire 108 has an unconstricted width between 10 nm and 200 nm. In some embodiments, $I_w$ is between 0.5 µA and 10 µA.

Figure 2D:
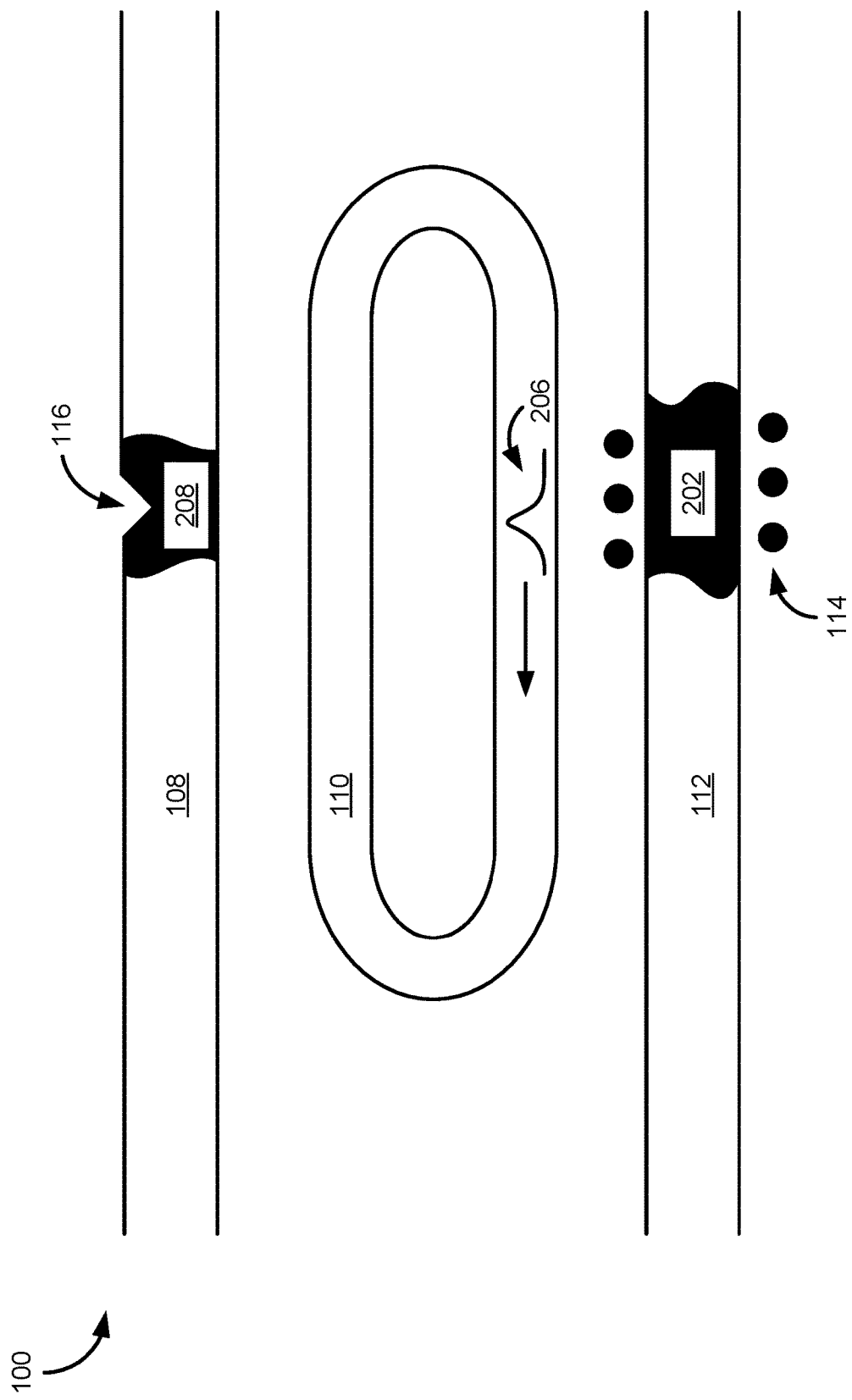

FIG. 2D illustrates superconducting memory cell 100 at a fourth time (e.g., after the third time). FIG. 2D illustrates that, as a result of write current 204 reaching notch 116 (and thereby exceeding the critical current), a resistive region 208 is formed in first wire 108.

Figure 2E:
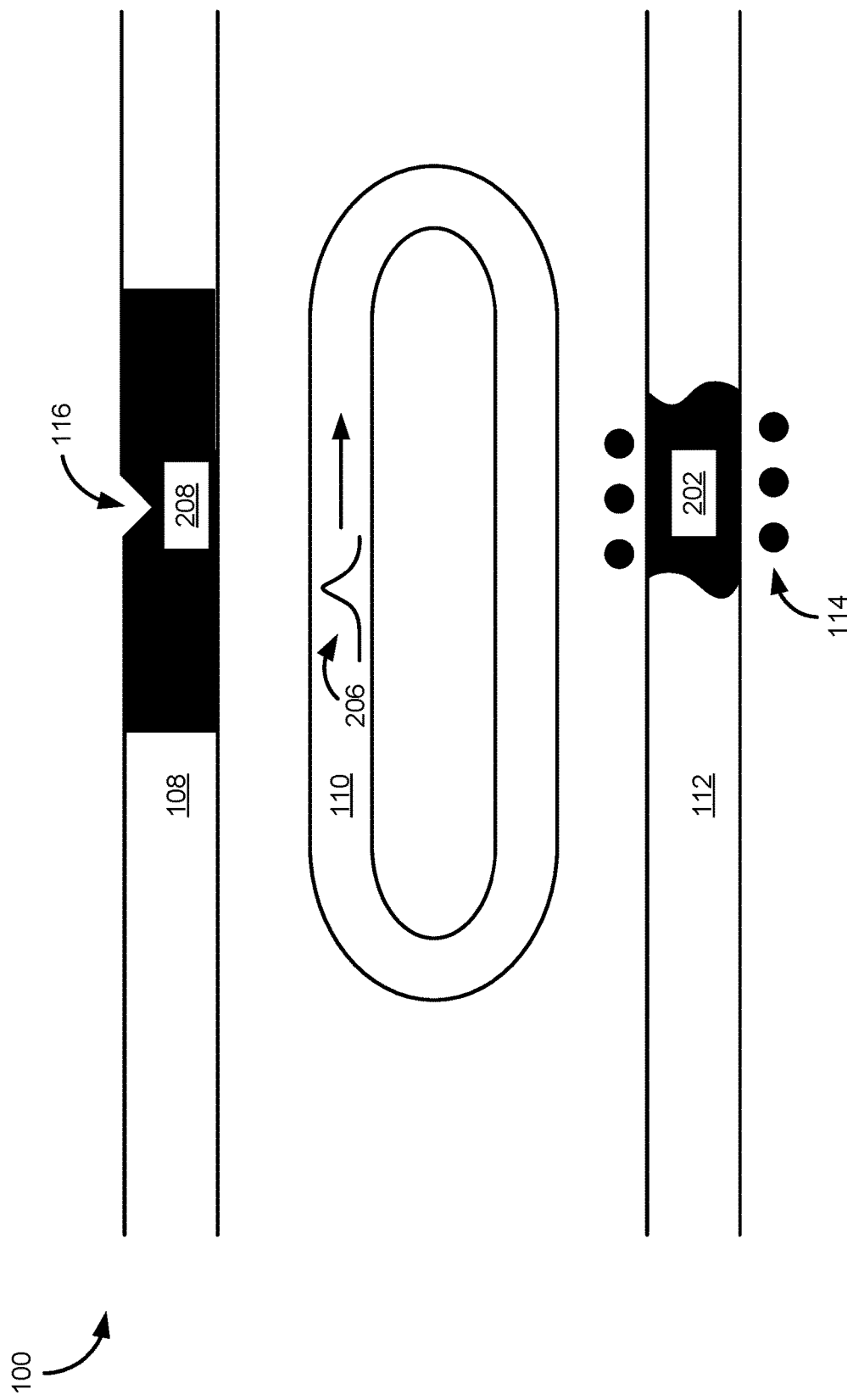

FIG. 2E illustrates superconducting memory cell 100 at a fifth time (e.g., after the fourth time). In some embodiments, the resistive region 208 expands from notch 116 as the current is dissipated by the now-resistive first wire 108, which heats an expanding portion of first wire 108 above the critical temperature of the superconducting material. In some embodiments, resistive region 208 is sufficiently large so as to diminish or eliminate the capacitive coupling between first wire 108 and loop 110 below a predetermined threshold (e.g., lowers the capacitance between first wire 108 and loop 110 so that first wire 108 is effectively no longer in AC-electrical communication with loop 110). In some embodiments, write current 204 is shaped as a step function, such that:

$$I = 0 \text{ if } T < T_w; \quad (3)$$

$$I = I_w \text{ if } T \geq T_w. \quad (4)$$

In Equations (3)-(4) above, I is the current through first wire 108, $I_w$ is the predefined magnitude of write current 204, T is time, and $T_w$ is the time at which write current 204 is applied. By shaping write current 204 as a step function, first wire 108 is maintained in a resistive state after write current 204 is applied. In some embodiments, Equations (3)-(4) hold as long as persistent current 206 is stored on loop 110 (e.g., Equations (3)-(4) hold until the logic state of superconducting memory cell 100 has been read out), after which the current through the first wire 108 can be turned off and the superconducting memory cell 100 can be returned to a state where it is ready to be written again.

Figure 2F:
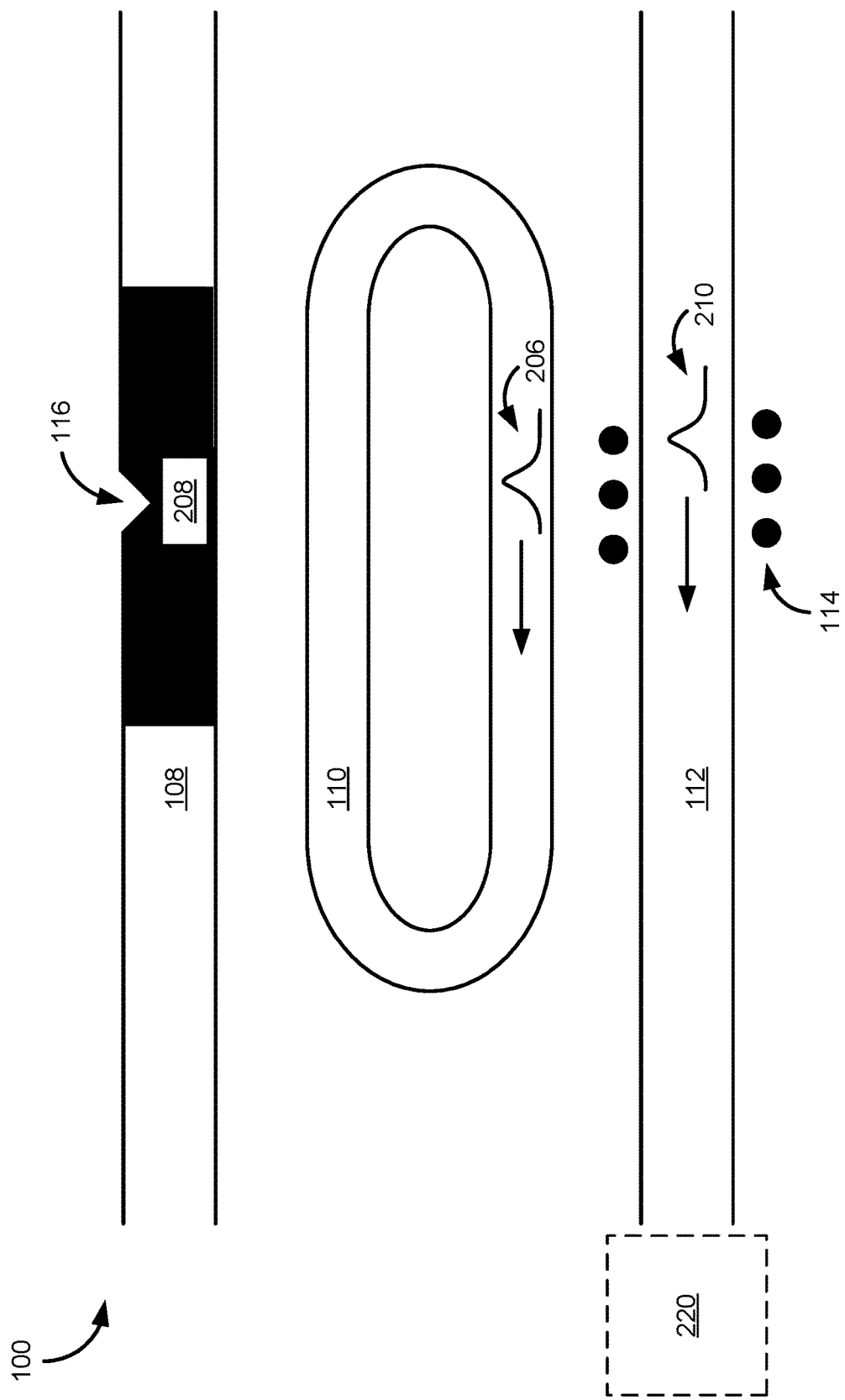

FIG. 2F illustrates superconducting memory cell 100 at a sixth time (e.g., after the fifth time). As shown in FIG. 2F, at the sixth time, heating element 114 has been deactivated (e.g., current is no longer passing through the resistive heater). In some embodiments, when heating element 114 is deactivated, second wire 112 cools below its superconducting material's critical temperature, transitioning second wire 112 to a superconducting state (e.g., when cooled, the entirety of second wire 112 is in the superconducting state and no portion of second wire 112 is in a resistive state). When loop 110 and second wire 112 are both in a superconducting state, loop 110 and second wire 112 are capacitively coupled. Under these conditions, a read current 210 is formed in second wire 112 in response to persistent current 206 (e.g., persistent current 206 jumps to second wire 112 to form read current 210). In some embodiments, second wire 112 transmits the read current to additional circuitry 220 (e.g., a sense amp). In some embodiments, second wire 112 is electrically coupled to additional circuitry 220 for detecting and/or measuring read current 210 in second wire 112.

Figure 3:
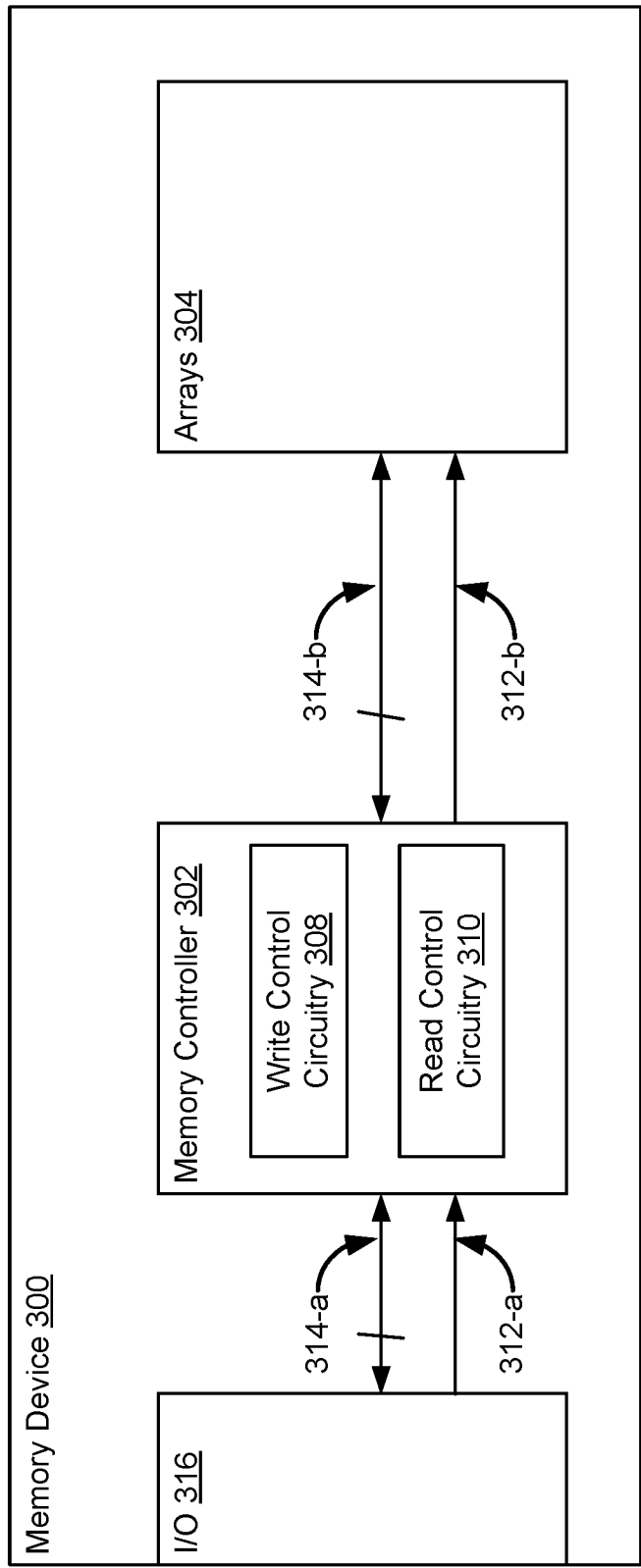
FIG. 3 is a schematic diagram illustrating a memory device having superconducting memory cells in accordance with some embodiments.

FIG. 3 illustrates a memory device 300 with superconducting memory cells in accordance with some embodiments. In some embodiments, the memory device 300 comprises a non-transitory memory (e.g., a machine-readable storage medium). Memory device 300 includes memory controller 302 and one or more arrays of memory cells 304. For example, each memory cell in the one or more arrays of memory cells 304 is a superconducting memory cell 100, described above with reference to FIGS. 1A-1D and FIGS. 2A-2F.

In some embodiments, the one or more arrays of memory cells 304 are formed by one or more memory dies. In some embodiments, each memory die includes one or more die planes that each have their own circuitry (e.g., sense amplifiers and the like) to support memory operations (e.g., read/write/erase processes that are the result of host commands from an external computer system or that are the result of internal processes/calculations). In some embodiments, the memory arrays are organized into pages (e.g., a page of 2212 eight-bit bytes, where each bit is a value stored in an individual superconducting memory cell 100). In some embodiments, a page corresponds to a word line (or a portion of a word line) on a die plane. In some embodiments, pages are organized into blocks (e.g., a block is 64 pages), and there are a fixed number of blocks per die plane (e.g., 8224 blocks).

In some embodiments, memory device 300 includes circuitry to support memory operations (e.g., read/write/erase processes that are the result of host commands from an external computer system or that are the result of internal processes/calculations). For example, memory device 300 includes write control circuitry 308 to address a respective memory cell in the array of memory cells and direct a write current to the respective memory cell. In some embodiments, memory device 300 includes read control circuitry 310 to address a respective memory cell in the array of memory cells and read out a respective memory cell (e.g., by deactivating its heating element 114 so as to transition its second wire to a superconducting state, as described above).

In some embodiments, memory device 300 includes an input/output (I/O) module 316 that receives host commands (e.g., read/write/erase commands) and/or data from an external host computer or external computing circuitry. Memory device 300 further optionally includes control lines 312 (e.g., control lines 312-a and 312-b) for transferring commands between components and data buses 314 (e.g., data buses 314-a and 314-b) for transferring data between components.

Figure 4:
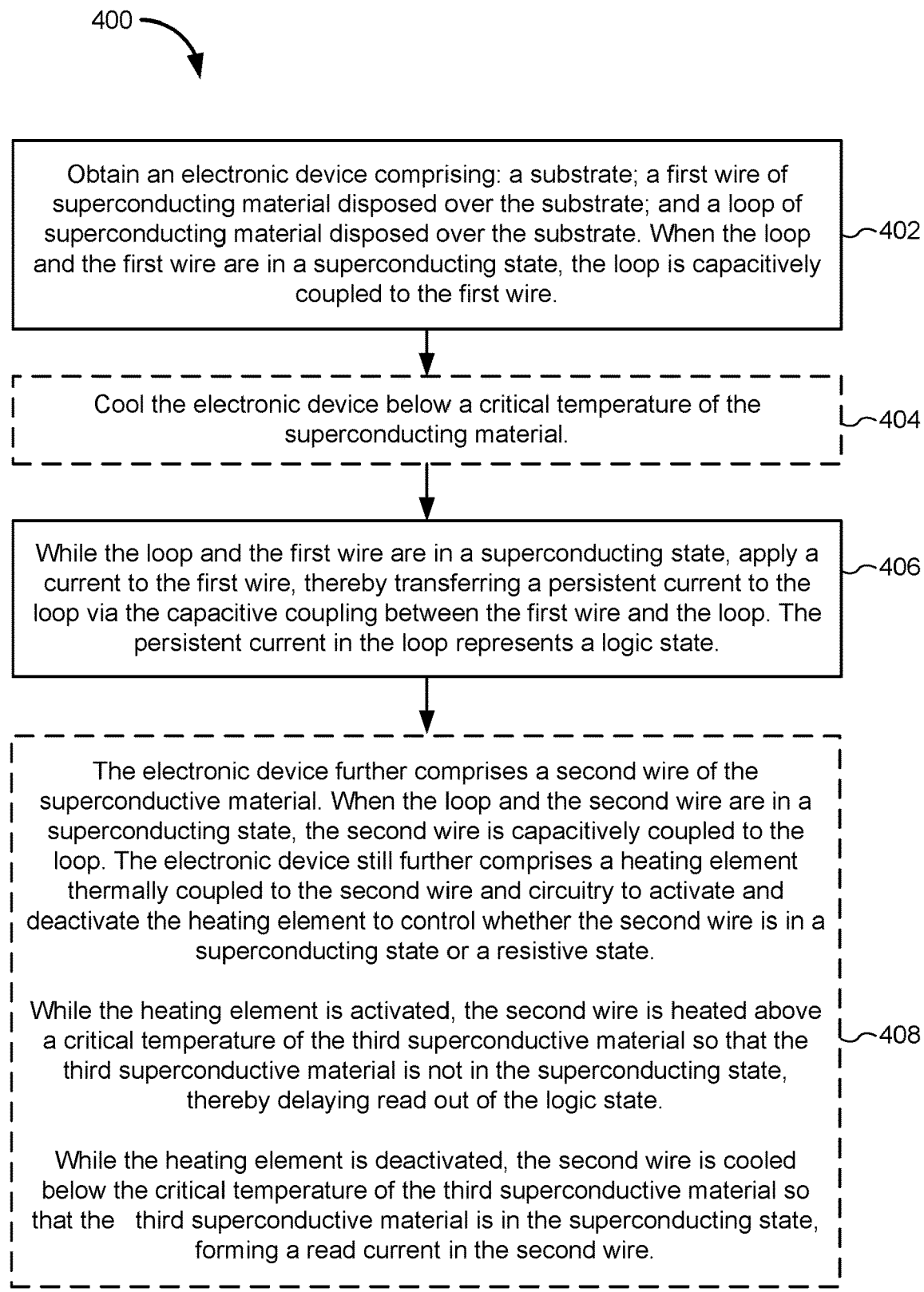
FIG. 4 is a flow diagram illustrating a method of using a memory device based on superconducting materials in accordance with some embodiments.

FIG. 4 illustrates a method 400 of using an electronic device (e.g., a superconducting memory cell) in accordance with some embodiments.

Method 400 includes obtaining (402) an electronic device comprising a substrate, a first wire of superconducting material disposed over the substrate, and a loop of superconducting material disposed over the substrate. When the loop and the first wire are in a superconducting state, the loop is capacitively coupled to the first wire. For example, in some embodiments the electronic device includes a superconducting memory cell 100 (FIGS. 1A-1C).

In some embodiments, method 400 includes cooling (404) (e.g., cryogenically) the electronic device below a critical temperature of the superconducting material. In some embodiments, cooling the electronic device includes cooling an entire chip that the electronic device is fabricated on. In some embodiments, when the electronic device includes different superconducting materials (e.g., the first wire is made of a different superconducting material than the loop), cooling the electronic device includes cooling the device below the lowest critical temperature of any of the superconducting materials. In some embodiments, the cooling is performed using any cooling technology that can reach the critical temperature(s) of the superconducting material. For high-temperature superconductors, these technologies include cooling with liquid nitrogen. For lower-temperature superconductors, technologies such as dilution refrigeration, adiabatic demagnetization, and helium refrigeration can be used.

The method further includes, while the loop and the first wire are in a superconducting state, applying (406) a current to the first wire, thereby transferring a persistent current to the loop via the capacitive coupling between the first wire and the loop. The persistent current in the loop represents a logic state. In some embodiments, the presence of a persistent current in the loop represents a logical "1." In some embodiments, the presence of a persistent current in the loop represents a logical "0." In some embodiments, the current has a predefined magnitude. In some embodiments, applying the current to the first wire transitions the first wire to a resistive state (e.g., as described above with reference to FIGS. 2A-2F). In some embodiments, the current through the first wire is a step-function that maintains the first wire in a resistive state after the current has been applied.

In some embodiments, the electronic device further comprises (408) a second wire of the superconductive material. When the loop and the second wire are in a superconducting state, the second wire is capacitively coupled to the loop. The electronic device further comprises a heating element thermally coupled to the second wire and circuitry to activate and deactivate the heating element to control whether the second wire is in a superconducting state or a resistive state. While the heating element is activated, the second wire is heated above a critical temperature of the superconductive material so that the superconductive material is not in the superconducting state, thereby delaying read out of the logic state. While the heating element is deactivated, the second wire is cooled below the critical temperature of the superconductive material so that the superconductive material is in the superconducting state, forming a read current in the second wire. In some embodiments, the heating element is activated by default. In some embodiments, the method includes activating the heating element prior to application of the current to the first wire; maintaining activation of the heating element for a time period following application of the current to the first wire; and subsequently deactivating the heating element at a later time to read out a logical state of the memory device.

In some embodiments, the method further includes applying an erase operation to the electronic device. In some embodiments, applying the erase operation includes heating the loop above its critical temperature to transition the loop to a resistive state (thus dissipating the persistent current). In some embodiments, heating the loop above its critical temperature includes heating the entire electronic device (e.g., the entire chip) above the critical temperature of the loop. In some embodiments, heating the loop above its critical temperature includes ceasing to cool the electronic device. In some embodiments, the electronic device further comprises a second heating element thermally coupled to the loop and circuitry to activate and deactivate the second heating element to control whether the loop is in a superconducting state or a resistive state. The method further includes activating the second heating element to transition the loop to a resistive state to erase the logic state of the device.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that, although the terms first, second, etc., are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same current unless explicitly stated as such.

As used herein, the term "if" is, optionally, construed to mean "when" or "upon" or "in response to determining" or "in response to detecting" or "in accordance with a determination that," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method for storing data in a superconducting memory cell, the method comprising:
    applying, to a superconducting wire in the superconducting memory cell, a write current to store a data bit in a superconducting loop in the superconducting memory cell;
    transferring, to the superconducting loop, the write current to form a persistent current that circulates in the superconducting loop as a stored data bit, the write current being transferrable to the superconducting loop while the superconducting wire and the superconducting loop are both in a superconductive state; and
    in accordance with transferring the write current, transitioning the superconducting wire to a non-superconductive state.

2. The method of claim 1, wherein the superconducting loop is formed solely from a superconducting material.

3. The method of claim 1, wherein transitioning the superconducting wire to the non-superconductive state comprises: increasing a current density of the superconducting wire such that the current density exceeds a threshold current density that causes the superconducting wire to transition to the non-superconductive state.

4. The method of claim 3, wherein the superconducting wire includes a constriction and the current density exceeds the threshold current density at the constriction.

5. The method of claim 1, further comprising:
    reading the stored data bit from the superconducting loop using an additional superconducting wire.

6. The method of claim 5, wherein reading the stored data bit comprises:
    transitioning the additional superconducting wire from the non-superconductive state to the superconductive state to cause the persistent current to transfer to the additional superconducting wire while the superconducting loop and the additional superconducting wire are both in the superconductive state.

7. The method of claim 6, wherein transitioning the additional superconducting wire comprises deactivating a heater that applies heat to the additional superconducting wire such that a temperature of the additional superconducting wire is lowered past a threshold temperature and the additional superconducting wire transitions from the non-superconductive state to the superconductive state.

8. The method of claim 1, further comprising:
    applying, using a heater, heat to an additional superconducting wire to maintain the additional superconducting wire in the non-superconductive state, wherein, while the additional superconducting wire is in the non-superconductive state, the stored data bit does not transition from the superconducting loop to the additional superconducting wire.

9. The method of claim 1, wherein the superconducting memory cell is a component of an array of superconducting memory cells that store data bits in superconducting loops.

10. The method of claim 9, wherein control circuitry generates write currents that are applied to the array of superconducting memory cells to store the data bits in the array of superconducting memory cells.

11. A superconducting memory cell comprising:
    a superconducting wire configured to transmit a write current to store a data bit in the superconducting memory cell; and
    a superconducting loop configured to receive the write current from the superconducting wire and form a persistent current that stores the data bit in the superconducting loop, the write current causing the superconducting wire to transition from a superconductive state to a non-superconductive state so that the persistent current does not transfer to the superconducting wire and the stored data bit remains stored on the superconducting loop.

12. The superconducting memory cell of claim 11, wherein the superconducting loop is formed solely from a superconducting material.

13. The superconducting memory cell of claim 11, wherein the write current increases a current density in the superconducting wire such that the current density exceeds a threshold current density that causes the superconducting wire to transition to the non-superconductive state.

14. The superconducting memory cell of claim 13, wherein the superconducting wire comprises a constriction that causes an increase in the current density.

15. The superconducting memory cell of claim 11, wherein the superconducting memory cell further comprises an additional superconducting wire configured to read the stored data bit from the superconducting loop.

16. The superconducting memory cell of claim 15, wherein reading the stored data bit comprises transitioning the additional superconducting wire from the non-superconductive state to the superconductive state to cause the persistent current to transfer to the additional superconducting wire while the superconducting loop and the additional superconducting wire are both in the superconductive state.

17. The superconducting memory cell of claim 16, further comprising a heater configured to apply heat to the additional superconducting wire, wherein transitioning the additional superconducting wire comprises deactivating the heater such that a temperature of the additional superconducting wire is lowered past a threshold temperature and the additional superconducting wire transitions from the non-superconductive state to the superconductive state.

18. The superconducting memory cell of claim 11, further comprising:
   an additional superconducting wire; and
   a heater configured to apply heat to the additional superconducting wire to keep the additional superconducting wire in the non-superconductive state such that the stored data bit does not transition from the superconducting loop to the additional superconducting wire while the additional superconducting wire is in the non-superconductive state.

19. The superconducting memory cell of claim 11, wherein the superconducting memory cell is a component of an array of superconducting memory cells that store data bits in superconducting loops.

20. The superconducting memory cell of claim 19, wherein control circuitry generates write currents that are applied to the array of superconducting memory cells to store the data bits in the array of superconducting memory cells.

* * * * *